United States Patent [19]

Shreeve

[11] Patent Number: 4,918,385
[45] Date of Patent: Apr. 17, 1990

[54] METHOD AND PROCESS FOR TESTING THE RELIABILITY OF INTEGRATED CIRCUIT (IC) CHIPS AND NOVEL IC CIRCUITRY FOR ACCOMPLISHING SAME

[75] Inventor: Robert W. Shreeve, Corvallis, Oreg.

[73] Assignee: Hewlett-Packard Company, Palo Alto, Calif.

[21] Appl. No.: 307,727

[22] Filed: Feb. 7, 1989

Related U.S. Application Data

[62] Division of Ser. No. 51,888, May 18, 1987.

[51] Int. Cl.[4] ................... G01R 31/00; G01R 31/02
[52] U.S. Cl. ............................. 324/158 R; 371/22.6
[58] Field of Search ............ 324/73 R, 73 AT, 158 R; 371/21, 15, 27

[56] References Cited

U.S. PATENT DOCUMENTS

| | | | |
|---|---|---|---|
| 4,007,479 | 2/1977 | Kowalski | 357/70 |
| 4,195,195 | 3/1980 | de Miranda et al. | 357/70 |
| 4,336,495 | 6/1982 | Happe | 324/158 R |
| 4,380,805 | 4/1983 | Proebsting | 371/21 |
| 4,390,598 | 6/1983 | Phy | 357/69 |
| 4,459,607 | 7/1984 | Reid | 357/71 R |
| 4,651,088 | 3/1987 | Sawadd | 324/158 R |
| 4,670,714 | 6/1987 | Sievers et al. | 371/15 |
| 4,689,791 | 8/1987 | Ciuciu et al. | 371/27 |
| 4,698,588 | 10/1987 | Hwang et al. | 324/158 R |
| 4,706,157 | 11/1987 | Shimaza | 324/73 R |
| 4,706,249 | 11/1987 | Nadagawa et al. | 371/51 |
| 4,733,168 | 3/1988 | Blankenship et al. | 324/158 R |
| 4,751,679 | 6/1988 | Dehgrampour | 371/21 |
| 4,821,238 | 4/1989 | Fatematsu | 371/21 |

Primary Examiner—Reinhard J. Eisenzopf
Assistant Examiner—W. Burns
Attorney, Agent, or Firm—S. A. Kassatly; Roland I. Griffin

[57] ABSTRACT

Disclosed herein is a method and circuit useful in the testing of integrated circuit chips. On-chip test circuitry is provided at a selected location on an IC chip and energized while the chips are still mounted on a lead frame member, wound on reels and heated in an oven. Advantageously, the continuous lead frame member may be a tape automated bond (TAB bond) flexible circuit which is adapted for gang bonding to a large plurality of ICs before being wound on reels. In a preferred test circuit embodiment, the conductive on-off state of digital address circuity is controlled by applying a test signal potential to an input test pad and through a fuse to a common test circuit junction. This junction is in turn connected between a transistor and diode in a series control network which is operative to control the conductive state of the address circuitry. This network enables the input test pad to be used as both a test signal input connection and a ground connection for the IC test circuit.

5 Claims, 4 Drawing Sheets

BURNIN CABLE

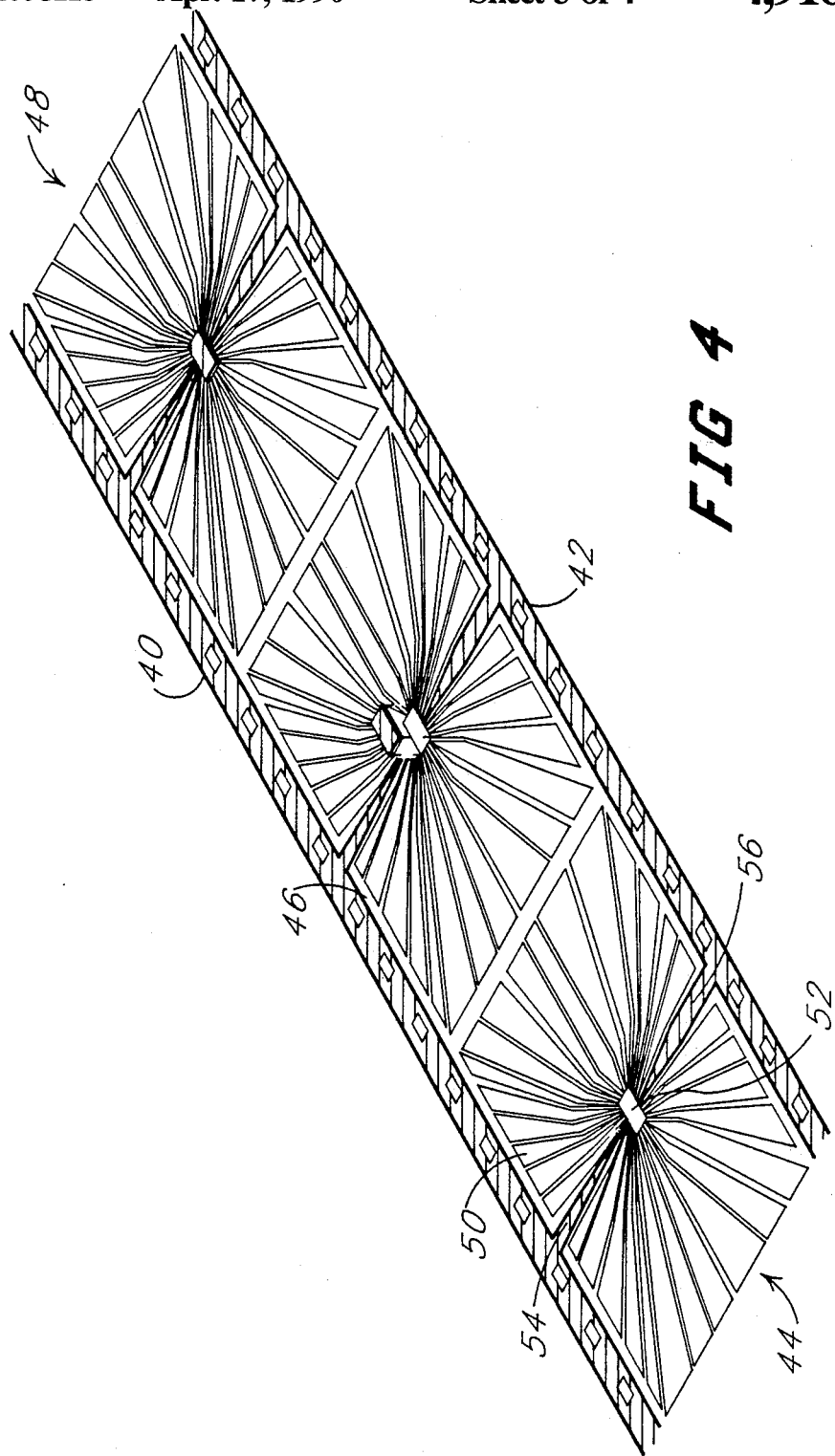

METHOD AND PROCESS FOR TESTING THE RELIABILITY OF INTEGRATED CIRCUIT (IC) CHIPS AND NOVEL IC CIRCUITRY FOR ACCOMPLISHING SAME

CROSS REFERENCE TO RELATED APPLICATIONS

This is a division of application Ser. No. 07/051,888, filed May 18, 1987.

TECHNICAL FIELD

This invention relates generally to the reliability testing of integrated circuit (IC) chips and more particularly to an improved method and related circuitry for accomplishing burn-in of these chips at a significantly reduced cost and with a minimum of space required.

BACKGROUND ART

In the manufacture of semiconductor integrated circuits where, for example, individual semiconductor chips are diced from a semiconductor wafer, it has been one practice to bond these chips to a continuous lead frame having many frame segments therein and then separate each chip and corresponding lead frame segment from the continuous frame for further subsequent reliability testing. One type of continuous flexible lead frame member which is particularly useful in practicing the present invention and which is well known in the art is referred to as a TAB bond circuit. The acronym "TAB" refers to tape automated bond and is described in many prior art references including U.S. Pats. 4,007,479, 4,195,195, 4,390,598 and 4,459,607.

The above reliability testing of integrated circuits will typically include the mounting of a certain number of the separated chips and supporting lead frame segments on a burn-in card and then inserting the burn-in card in a test oven. Here the individual IC chips are electrically connected to test circuitry for cycling the chips with a predetermined sequence of electrical signals. These signals are applied to certain nodes of these chips for a predetermined time and at a certain required elevated oven temperature.

The above electrical connection requires high tolerance fixturing using skilled labor and also requires a relatively large area of oven space for burn-in. This burn-in preparation and testing of these IC chips has been known to contribute to the final manufacturing cost per integrated circuit chip by about $2.00.

DISCLOSURE OF INVENTION

Accordingly, one object of this invention is to reduce the above cost of integrated circuit burn-in from about $2.00 per part to about $0.003 per part.

Another object is to provide a burn-in test method and circuit of the type described herein which enables the use of low tolerance test fixturing.

Another object is to provide a burn-in test method and circuit of the type described which requires substantially less burn-in oven space as compared to the known prior art.

Another object is to provide a burn-in test method and circuit of the type described which substantially reduces burn-in oven operating costs and integrated circuit test set-up costs.

A further object is to provide a novel test method of the type described which reduces labor requirements by 1/50 and which may be carried out using unskilled labor.

A feature of this invention is the provision of novel IC test circuitry which utilizes a minimum number of IC components to control the conductive state of test signal address circuitry, thereby minimizing the added cost and complexity to the associated IC chip.

The above objects, and related advantages and novel features of this invention are achieved by the provision of a new and improved reliability test method and accompanying circuit for accomplishing integrated circuit burn-in, and this method has substantially reduced IC manufacturing costs, tooling costs and engineering costs relative to the known prior art methods of IC reliability testing. This method and process includes initially providing test signal drive circuitry as an integral part of the integrated circuit chips to be tested. Next, the chips are secured to a continuous lead frame and then inserted in an oven where they are heated to a predetermined elevated temperature. When the elevated temperature is reached, an energizing DC voltage is applied to the lead frame which causes a test signal to be applied to a start-test input pad on the integrated circuit chip and thereby cycle the chip with preset signals for a predetermined time. The chips are then removed from the oven and are tested using test probes and associated IC test equipment.

In a preferred embodiment of the invention, the continuous lead frame member is a tape automated bond (TAB bond) type of lead frame which is well known to those skilled in the art and is described in further detail hereinbelow.

Thus, this novel process does not require high tolerance electrical fixturing, with associated labor costs, and it further substantially reduces the amount of oven space required relative to prior art processes. These prior art processes included separating the chips and mounting them on burn-in carriers in preparation for a burn-in operation.

This invention is also embodied in novel IC test circuitry which includes an input test pad for controlling the on-off state of digital address circuitry. The digital address circuitry, including an oscillator and counter, is turned on when the input test pad in connected to ground potential. The test pad is connected through a fuse to a common circuit junction which interconnects a transistor and a diode between a DC bias voltage and a point of reference potential. The diode conducts to drive the common circuit junction to essentially ground potential when the address circuitry is turned on, whereas the diode turns off and the transistor turns on to drive the address circuitry to its non-conductive state. This novel on-off circuit connection enables a single conductive pad or input test node to be used as both a ground connection and an input test signal pad for turning on the address circuitry.

The present invention and its many significant advantages will become more readily apparent in the following description of the accompanying drawings.

BRIEF DESCRIPTION OF THE DRAWINGS

FIG. 4 is a perspective view showing how the integrated circuit chips are mounted on continuous TAB bond circuit-type of continuous lead frame prior to the reliability testing thereof.

BEST MODE FOR CARRYING OUT THE INVENTION

Figure 1:
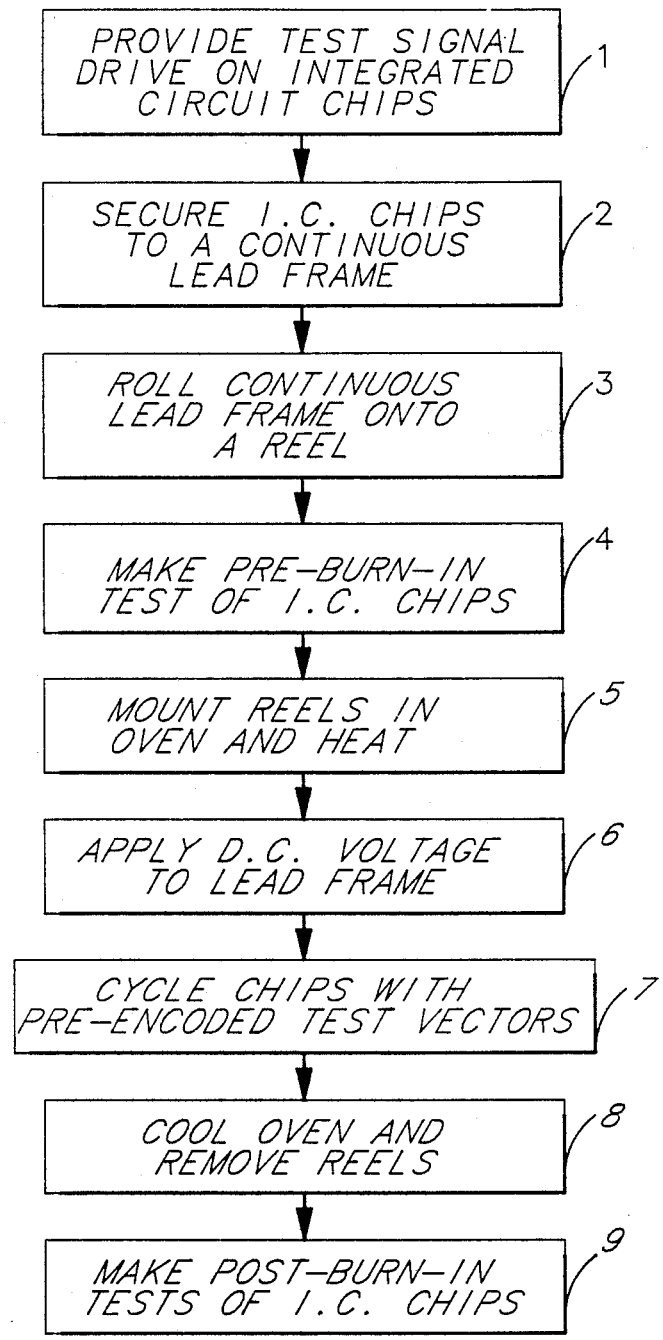
FIG. 1 is a process flow diagram indicating the process steps which are carried out in sequence in accordance with a preferred embodiment of the invention.

Referring now to FIG. 1, this initial figure shows the basic nine (9) steps in a process for practicing the present invention in accordance with a preferred embodiment thereof. The descriptive legend in this figure is self-explanatory and will become better understood after reading the description of the other figures herein. However, to cover the possibility that legend in the drawings is not permissible in certain foreign country patent applications, the legend of FIG. 1 is repeated below as follows:

1. Provide test signal drive on integrated circuit chips.
2. Secure IC chips to a continuous lead frame.
3. Roll continuous lead frame onto a reel.
4. Make pre burn-in test of IC chips.
5. Mount reels in oven and heat.
6. Apply DC voltage to lead frame.
7. Cycle chips with pre encoded test vectors.
8. Cool oven and remove reels.
9. Make post burn-in test of IC chips.

Figure 2:
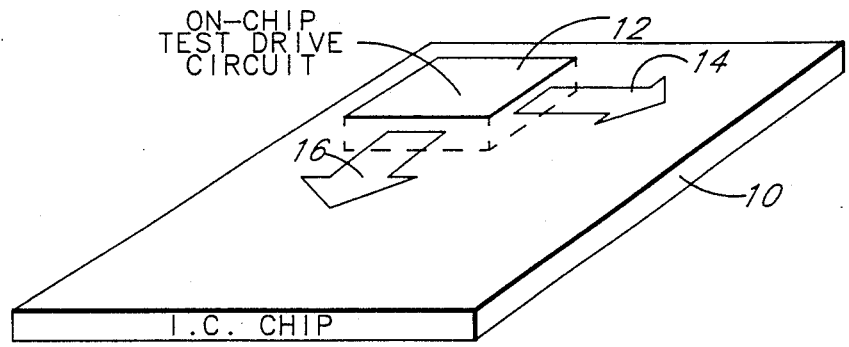
FIG. 2 is a general functional perspective view to illustrate the on-chip inclusion of the burn-in test circuit used in carrying out the process of FIG. 1.

Referring now to FIG. 2, there is shown in a generally functional perspective view an integrated circuit chip 10 in which an on-chip test drive circuit 12 has been fabricated in a preselected location thereof using standard state of the art MOS planar technology. The test drive circuit 12 may, for example, include output conductors 14 and 16 for applying test signals in different directions and to a multiplicity of components (not shown) within the monolithic integrated circuit chip 10.

Figure 3:
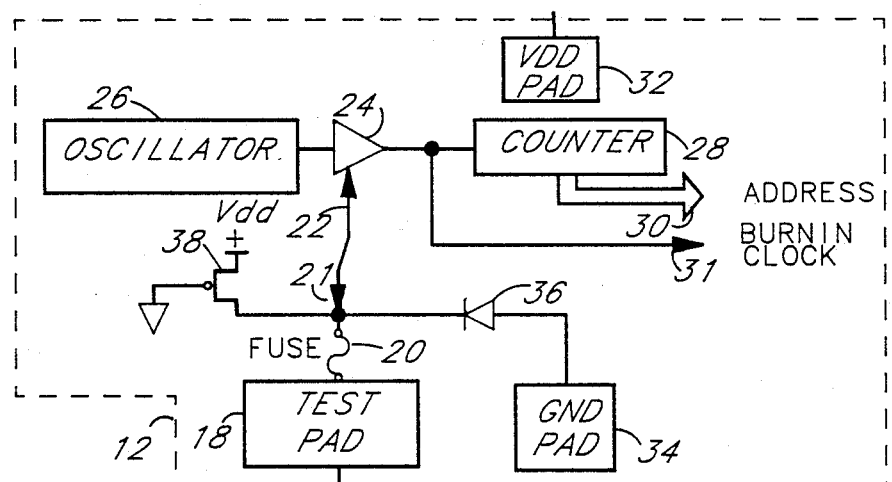
FIG. 3 is a schematic circuit diagram of the on-chip test signal drive circuitry according to the invention.

The on-chip test drive circuit 12 is shown in some schematic detail in FIG. 3 and includes an input test pad 18 which serves as both the burn-in test mode enable pin and the integrated circuit ground connection during burn-in. The test pad 18 is connected to a fuse 20 which, is utilized to disable the die 10 if-the die begins to draw an excessive amount of current. The fuse 20 is connected by way of a conductor 22 to one input of an inverter amplifier 24 which in turn is driven by an oscillator 26. The oscillator 26 provides a clock signal to increment the counter 28 which is connected as shown to the output of the inverter amplifier 24. The oscillator thus clocks the die 10 in the burn-in mode, and the counter 28 is somewhat IC dependent, but usually includes a counting circuit which provides an address signal at its output connection 30. This address signal is utilized for exercising the various test nodes (not shown) of the integrated circuit 12.

An operating DC bias voltage pad 32 is provided as shown at an upper location in the test drive circuit 12 and adjacent the integrated circuit boundary, and a ground pad 34 is provided at a lower portion of the circuit 12. The pad 32 is connected via interconnects (not shown) and to a transistor 38 described below for providing a DC operating bias for this transistor. The ground pad 34 is further connected through a PN junction diode 36 and to a pull-up metal oxide semiconductor field effect transistor (MOSFET) 38. This circuit consisting of diode 36 and MOSFET 38 serves to isolate the ground pad 34 from the test pad 18 during normal IC operation so that the test mode of operation is rendered inoperative by the conduction of MOSFET 38.

When the test circuit of FIG. 3 is in its test-mode of operation, the test pad 18 is enabled and this pad serves as a ground connection. Here, the inverter 24 is connected between $V_{dd}$ and ground, and the oscillator 26 applies a clock signal through the inverter 24 to drive the counter 28 and provide the test vector signals at its output 30. In addition, a sync clock signal is available on line 31 to synchronize the cycling of address signals on line 30 during burn-in. During this test-mode of operation, the diode 36 is forward biased, conducting a very small amount of current through the MOSFET 38 and driving line 22 to approximately ground potential. Then, when ground potential is removed from the test pad 18, the diode 36 becomes reverse biased and enables the MOSFET 38 to become fully conductive and thereby pull conductor 22 up to $V_{dd}$. This switching action in turn turns off the inverter 24 and thereby disables the IC test circuit in the normal IC mode of operation.

Referring now to FIG. 4, there is shown a tape automated bond (TAB bond) type of continuous and flexible lead frame member including outer indexed frame pieces 40 and 42. A plurality of adjacent lead frame segments 44, 46 and 48 extend as shown from the continuous pieces 40 and 42 and into a central region of the lead frame where the individual lead members 50 of the frame segments terminate in a predefined and preconfigured IC mounting area 52. The central IC die receiving area 52 is adapted to receive the integrated circuit die 10 as shown in the central segment 46 of the lead frame, and the die 10 becomes firmly gang bonded to and supported by the various (thirty are shown) lead frame members as indicated in the right hand segment 48 of the lead frame.

One frame piece 40 may, for example, be connected to a DC bias voltage $V_{dd}$ and the other frame piece 42 may be connected to ground. This operating bias is applied to the integrated circuit 10 by means of a central lead frame connections 54 and 56 which extend inwardly to the central IC mounting area within each of the lead frame segments 44, 46 and 48. This IC die bonding technique using TAB type lead frame members is well known in the art as indicated above and will therefore not be described in further detail herein.

Figure 5:
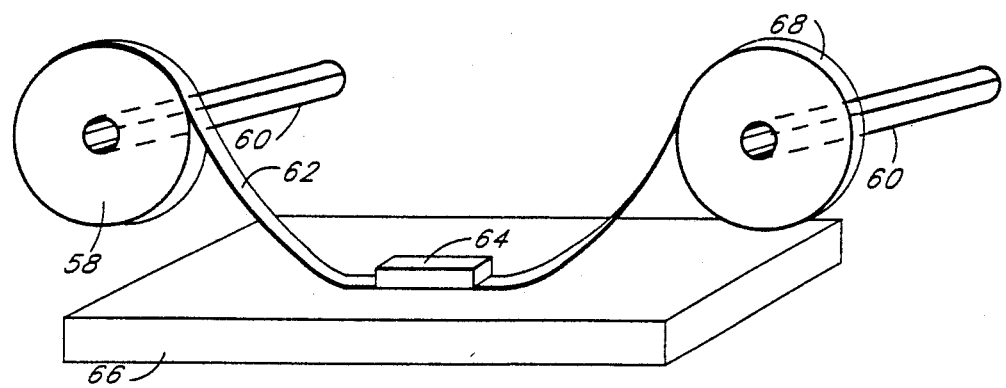
FIG. 5 is an abbreviated isometric view showing the pre-burn-in testing of the IC chips after the TAB bond lead frames in FIG. 4 have been wound onto cylindrical reels.

Once the integrated circuit chips 10 have been bonded to the TAB lead frame circuit as shown in FIG. 4, then the continuous TAB lead frame is wound onto a supply reel 58 as shown in the left hand portion of FIG. 5. The supply reel 58 is mounted on a spool 60 which is rotated using standard known automated assembly processes in order to move the TAB lead frame 62 to an IC test station 64 located on the test bench 66 and then onto a take up reel 68. Each integrated circuit on the lead frame 62 is tested in a sequence at the test station 64 by applying probes (not shown) to various nodes of the integrated circuits to determine if there are any pre burn-in defects in these circuits. Each supply reel 58 will typically contain a wound TAB lead frame 62 having about 200 integrated circuit chips mounted thereon.

Figure 6:
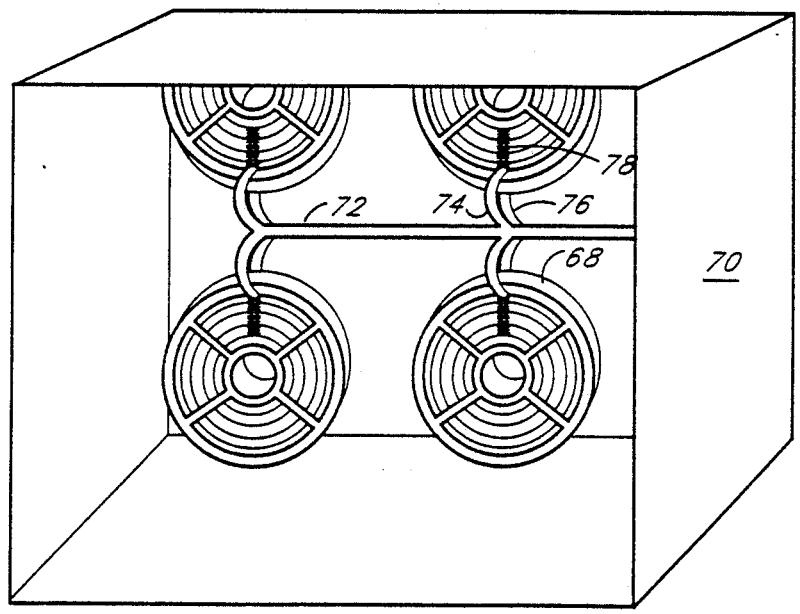
FIG. 6 is an isometric view showing how the take-up reels in FIG. 5 are mounted in an oven and connected to a DC operating bias for burn-in testing.

When the pre burn-in testing in FIG. 5 is completed, the take up reels 68 therein are transferred to an oven 70 as shown in FIG. 6. Each oven 70 will typically have a volumetric capacity for receiving about 16 of the reels 68, and each oven is connected to receive a DC bias voltage $V_{dd}$ and its return ground connection by means of a flat cable 72. Reel connections 74 and 76 extend to each of the reels 68, and a spring loaded clip member 78 is provided at the end of each of the leads 74 and is operative to be spring clipped to each adjacent cylindrical wall within the reel. In this manner, uniform DC voltage distribution is provided to all of the integrated circuits 10 mounted on the TAB lead frame wound on each of the reels 68.

Figure 7:
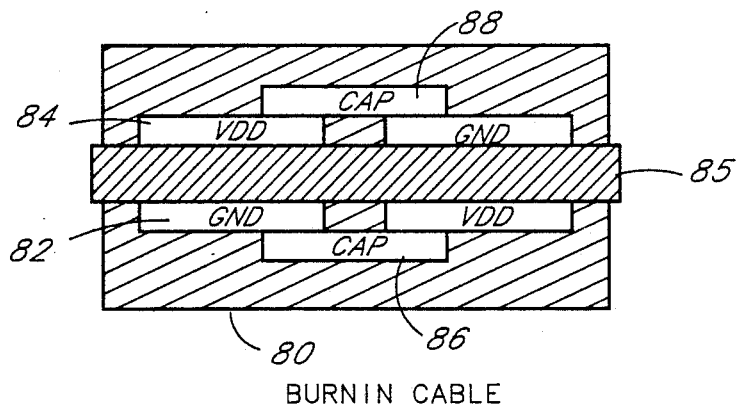
FIG. 7 is a cross-section view of the flat cable used in FIG. 6 to provide DC bias to the reels mounted therein.

After the reels 68 have been mounted in the oven 70 as shown in FIG. 6 and the oven 70 is brought up to a predetermined elevated temperature, typically on the order of about 150° C., a DC bias voltage $V_{dd}$ is then applied to each of the reels 68 via cable 72 to cycle each of the integrated circuit chips for a predetermined testing time. Burn-in is typically initiated on a reel by connecting +5.7 volts to one side 40 of the TAB lead frame (see FIG. 4) and 0 volts to the other side 42 thereof. While stable voltage supplies are readily available, connecting a DC power source directly to the reel 68 presents some major problems, for example, where high di/dt noise is created by the simultaneous switching of drivers in the 200 IC test drive circuits on each reel. Since the resulting instantaneous di/dt noise on the supply cable 72 can be very large, a special cable of the type shown in cross-section view in FIG. 7 was designed to optimize its distributed capacitance and to minimize its self inductance. The cross section of the cable 72 is shown in enlarged detail in FIG. 7 and includes $V_{dd}$ and ground plates 82 and 84 respectively on each side of a central cable support member 85 and chip capacitors 86 and 88 mounted as shown in the central region of the cable 72. The cable 72 provides power between $V_{dd}$ and ground and extends physically between a remote burn-in power supply (not shown) and the ICs on the burn-in reels.

After a typical burn-in period of 168 hours has been reached, the reels 68 are disconnected from the spring clip members 78, removed from the oven 70, and again transferred to the integrated circuit test station of FIG. 5. At this station, a post burn-in testing of each of the integrated circuits 10 is again carried out at the IC test location 64 in order to detect any post burn-in failures and defects which may now exist in any of the integrated circuits.

The above-described novel method of testing integrated circuits has been used in actual practice to burn-in 1500 parts, and both the loading and unloading time for the reels into and out of the oven 70 has been accomplished in about 6 minutes each. In addition, there has been achieved an oven packing density of one (1) cubic inch per lead frame segment, while simultaneously eliminating the need for engineering time to develop long term life and moisture resistant printed circuit (PC) cards. Finally, PC card cost savings provided by the present invention has exceeded thirty thousand dollars ($30,000.00), and simultaneously project schedules have been substantially advanced.

I claim:

1. A test circuit for use in cycling integrated circuits during burn-in, comprising:

a. a test mode for receiving a reference potential during a test operation,
   b. test vector address circuitry for applying test vector signals to an integrated circuit during the test mode of operation,
   c. enable means connected between said test node and said address circuitry for applying an enable reference potential to said address circuitry during test operation, and
   d. disable means connected between a DC bias and a reference potential for switching from said test operation upon removal of said reference potential from said test node and thereby disabling said address circuitry, said disable means includes a diode and a transistor connected in series between a DC bias voltage and a point of reference potential, and both said diode and transistor connected to said test node, whereby the removal of a reference potential from said test node controls conductivity in both said diode and transistor and in turn is operative to enable and disable said address circuitry.

2. The test circuit defined in claim 1 wherein said address circuitry includes an oscillator connected in series with an output counter.

3. A test circuit for use in cycling integrated circuits during burn-in, comprising: a test node for receiving a reference potential during a test operation, test vector address circuitry for applying test vector signals to an integrated circuit during the test mode of operation, enable means connected between said test node and said address circuitry for applying an enable reference potential to said address circuitry during test operation, disable means connected between a DC bias and a reference potential for switching from said test operation upon removal of said reference potential from said test node and thereby disabling said address circuitry, said test node is connected to a common circuit junction at which the voltage is switched from a high state to a low state and vice versa for controlling the conductive state of said address circuitry, a transistor is connected between said common circuit junction and a bias potential, and a diode is connected between said common circuit junction and a point of reference potential, whereby said diode and transistor alternately conduct to in turn switch said address circuitry from a conductive state to a non-conductive state in the test mode and normal IC mode of operation, respectively.

4. A test circuit for use in cycling integrated circuits during burn-in, comprising: a test node for receiving a reference potential during a test operation, test vector address circuitry for applying test vector signals to an integrated circuit during the test mode of operation, enable means connected between said test node and said address circuitry for applying an enable reference potential to said address circuitry during test operation, and disable means connected between a DC bias and a reference potential for switching from said test operation upon removal of said reference potential from said test node and thereby disabling said address circuitry, said disable means includes a current switching means connected to said test node and operative between state of low and high conductivity to switch voltage levels at said test node and enable and disable said test circuit, respectively.

5. The test circuit defined in claim 4 wherein said current switching means includes a diode and a transistor connected in series between a DC bias voltage and a point of reference potential.

* * * * *